March 5, 1963 J. J. LONG 3,080,542

INFRARED DETECTOR AND METHOD OF MANUFACTURE THEREOF

Filed Jan. 2, 1959 2 Sheets-Sheet 1

Jasper J. Long,

INVENTOR.

BY.

[signature]

ATTORNEY.

March 5, 1963 J. J. LONG 3,080,542

INFRARED DETECTOR AND METHOD OF MANUFACTURE THEREOF

Filed Jan. 2, 1959 2 Sheets-Sheet 2

Jasper J. Long,
*INVENTOR.*

*BY.*

W. H. Mac Allister Jr

*ATTORNEY.*

United States Patent Office 3,080,542

Patented Mar. 5, 1963

3,080,542

INFRARED DETECTOR AND METHOD OF MANUFACTURE THEREOF

Jasper J. Long, Santa Barbara, Calif., assignor to Santa Barbara Research Center, Goleta, Calif., a corporation of California Filed Jan. 2, 1959, Ser. No. 784,813

20 Claims. (Cl. 338—18)

This invention relates to long wavelength electromagnetic radiation detection apparatus and to methods for the manufacture and assembly thereof. More particularly, the invention relates to infrared radiation detector cells and to methods for providing extremely low-noise electrical connections to an infrared radiation sensitive element by techniques requiring little or no heat.

It is known that the operation of many semiconductive photosensitive devices is dependent upon the raising of electrons from the valence band into the conduction band by the energy of electromagnetic radiation of long wavelengths (i.e., 1 to 10 microns). Many of the semiconductive materials employed for this purpose such as lead selenide or sulfide have an energy band gap of such small energy difference as to permit the excitation of electrons into the conduction band by ambient thermal energy. Excitation due to such ambient thermal energy is generally termed "noise" and may be eliminated by maintaining the infrared sensitive elements at temperatures substantially below 50° K., preferably at the temperature of liquid helium (4° K.).

It has been found, however, that the nature of the necessary electrical connections to the infrared sensitive material as well as the manner of making these connections have a significant effect on the freedom of these devices from noise even when operated at the requisite low temperatures.

The particular type of infrared radiation detector cell to which the invention pertains comprises a thin deposited layer of radiant or photo-energy sensitive materials such as lead selenide or sulfide on a substrate. These materials are hereinafter referred to as photosensitive materials. Electrical contact to the photosensitive layer is made by evaporating a thin layer of metal such as gold on each end of the sensitive layer. This thin metallic layer does not provide an exceptionally firm foundation for the connection of leads thereto and the situation cannot be corrected by making the metallic layer thicker; if too thick a layer of gold, for example, is deposited, it has been found that the gold is in such excess that the amount of photosensitive material thereunder is relatively negligible or is substantially inoperative as a photosensitive material. That is, a thick gold-plated region acts as if the entire region were gold. It has been proposed with some success, to connect leads to the thin gold-coated region by more or less conventional soldering techniques. However, such techniques require an extremely close control of the total heat employed for soldering because of the adverse effects of heat on the photosensitive material. Indium solders do not readily wet the gold-coated surface and reproducibly good connections are difficult to obtain without using fluxing agents which are undesirable because of their chemical action on the material and the tendency to form or leave undesirable impurities on the device.

It has also been proposed, again with some success, to make contact to the thin gold-coated area with electrically conductive paints containing graphite or silver. Such contacts, however, are of relatively high resistance and therefore undesirable for use with low voltages. Furthermore, it will be appreciated that sufficient surface area must be provided to permit the application of such electrically conductive paints by brushing or spraying techniques. Hence, this method imposes a limit on the size of the cell. All of the prior art methods proposed have been accompanied to some degree by "contact noise" directly traceable to the nature of the contact or the method of making the contact.

It is therefore an object of the invention to provide an improved method for making electrical contact to a photosensitive element.

Another object of the invention is to provide an improved infrared device having a low-noise electrical contact to a photosensitive element thereof.

Another object of the invention is to provide an improved method for making low-noise electrical contacts to infrared sensitive elements which method requires the utilization of little or no heat.

Another object of the invention is to provide an improved infrared device having a structurally rugged low-noise electrical contact to an infrared sensitive element thereof.

These and other objects and advantages of the invention are realized by utilizing the discovery that a small body of a soft metal such as indium or tin-indium alloy may be spun or rotated in place on the thin metallic film which is disposed on the thin layer of photosensitive material without the use of heat or fluxing agents. Such spinning or rotation of a soft metal body results in the penetration of the soft metal into and through the thin metallic film as well as through the layer of photosensitive material to the substrate, with a large portion of the soft metal body retaining its shape and position on the thin metallic film thus providing a ready electrode for the connection thereto of lead wires by embedding the wires in the exposed portion of the soft metal as by pressure alone or by the momentary application of heat. Due to the penetration of the soft metal through intervening layers, a strong adherence to the substrate is obtained and thus the soft metal electrode is anchored to the substrate making an exceptionally rugged device.

The invention will be described in greater detail by reference to the drawings in which.

Figure 1:
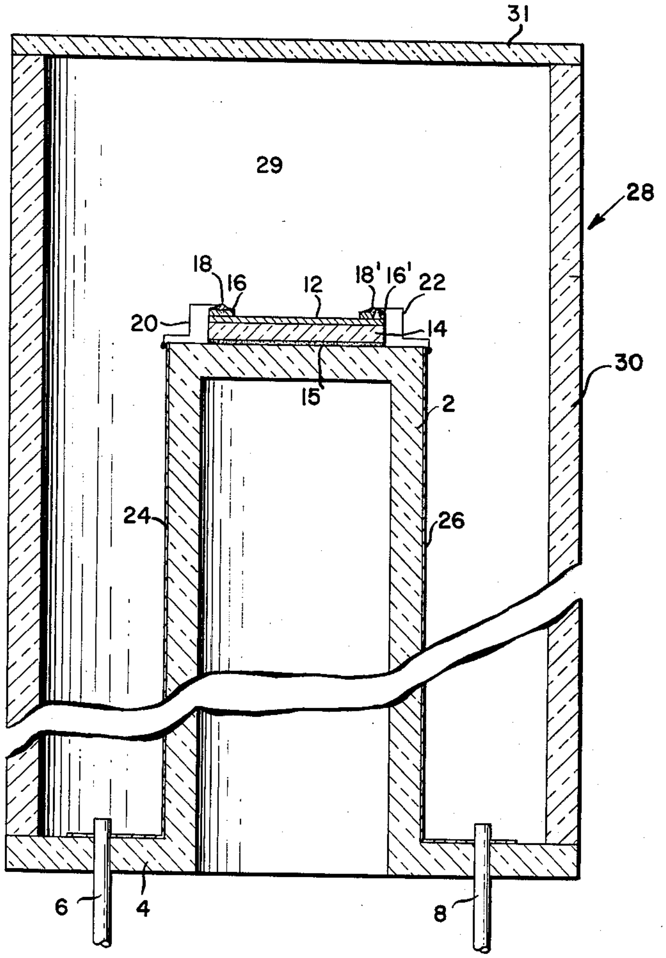
FIG. 1 is an elevational, cross-sectional view of an infrared detector device mounted in a Dewar flask and embodying the invention.

Referring now to the drawings and in particular to FIG. 1, a typical one-cell photosensitive device as shown therein may be made and assembled as follows. A header assembly including a glass re-entrant tubular member 2 and an integral glass base 4 is provided with a pair of relatively rugged electrical leads or pins 6 and 8 which extend through the base 4 and are hermetically fused thereto. These pins 6 and 8 may be of rhodium-plated Kovar metal, for example, and advantageously have substantially the same coefficient of thermal expansion as the glass base to which they are fused. The outer envelope assembly 28 is not mounted and fused to the base member 4 until final assembly and seal as will be explained hereinafter.

The photosensitive device per se comprises a thin film 12 of lead selenide or sulfide, for example, deposited on and firmly adherent to a substrate member 14. The film 12 may be about one micron in thickness, for example. Such a film of lead selenide may be prepared and deposited by the process described in the copending application of T. H. Johnson, S.N. 784,820, filed January 2, 1959, and assigned to the instant assignee. The substrate may be of glass, quartz, sapphire, or any one of various ceramic materials such as alumina or titania. After sensitization of the photosensitive layer as by heating in air for several minutes at a temperature between 350° and 450° C., thin layers 16, 16' of gold are evaporated onto the photosensitive layer 12 through a mask by techniques well known in the art so as to provide electrical contact to opposite sides of the photosensitive layer as shown. The gold films 16, 16' may be preferably about 5 to 10 microns thick, for example.

It should be appreciated that the dimensions of the substrate and the photosensitive layer thereon are relatively small. For example, the substrate 14 may be about 2.5 mm. square and 0.007" thick. The photosensitive layer 12 on the substrate may be about 2.5 mm. square with the gold film areas 16, 16' thereon each being about 0.040" x 0.026", so as to leave exposed an area of the photosensitive layer about 0.003" x 0.026". Hence, it is necessary to firmly attach a lead to an extremely thin film of metal of very small area overlying a material highly sensitive to thermal effects.

Figure 2:
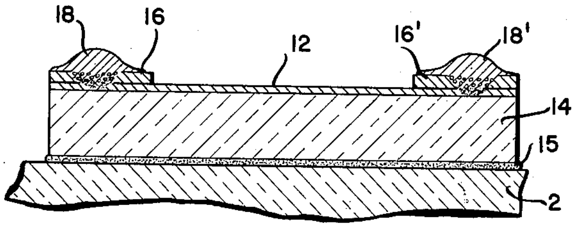
FIG. 2 is an elevational, cross-sectional greatly enlarged view of the infrared sensitive cell employed in the device of FIG. 1 showing the manner in which an indium sphere is employed to secure a rugged connection to the gold-plated area thereof.

According to the invention the first step in providing secure electrical connections to the small-area, thin metallic films 16 and 16' is by spinning or rotating a small indium or indium-tin alloy sphere in situ on the metallic films. Indium-tin alloys useful for this purpose may range up to 50% tin. The spheres may be about 0.013" in diameter, for example. The substrate 14 with its layer 12 of photosensitive material and gold films 16, 16' is placed in a jig having a rotatable spinning tool vertically disposed thereover. The rotatable spinning tool is provided with a tip having a slight concaved shaped recess therein into which the indium sphere may be placed and held by exerting a slight force thereon. The spinning tool is then lowered so as to lightly rest the sphere on the gold film at a predetermined point. The sphere is then spun or rotated in situ by rotating the spinning tool at 100–1000 r.p.m. for one second, for example. Alternatively, rotation of the tool with the sphere may be started before contacting the sphere to the gold film. The rotational speed is not critical; faster speeds may be employed to reduce the length of time required to obtain adherence of the sphere to the assembly. It should be understood that the pressure exerted upon the sphere during the spinning operation is just enough to cause the metal in peripheral portions of the sphere to flow outwardly across the gold surface in a thin film of about 0.001" to 0.002" thick, for example. Upon conclusion of this operation, it will be found that the spheres 18, 18', as shown in greater detail in FIG. 2, have penetrated both the gold film 16 and the photosensitive layer 12 and not only are in contact with the substrate 14 but are also firmly adherent thereto and thus are well-anchored in position. As also shown, a major portion of the sphere protrudes above the surface of the gold film to a height of about 0.005", for example. The next step is to attach the wires 20 and 22 to each of the spheres 18, 18'. The wires 20 and 22 may be copper, silver, or nickel, for example, and they may be plated with indium or indium-tin, for example. Typically, the wires 20 and 22 may have a diameter of about 0.002", for example. The wires are attached to the spheres by one of several techniques: they may be simply pressed into the spheres; the spheres may be given a slight groove by means of a sharp edge, and the wires pressed into the grooves and the metal of the spheres pressed therearound; or the wires may be contacted to the spheres and then very quickly and lightly touched with a hot soldering iron to cause the metal of the sphere to flow and wet the wire; or the wires may be first heated and then while still hot pressed into place in the spheres. In either of the latter instances where heat is employed, no adverse effects result since the heating is relatively so slight and momentary compared with prior art techniques.

Thereafter, the substrate assembly comprising the substrate, the photosensitive layer, the gold contact areas, and the leads connected thereto may be mounted on the upper end of the re-entrant portion 2 of the header assembly. The substrate 14 may be firmly secured to the re-entrant tube 2 by an adhesive 15 such as a mixture of potassium silicate and talc, for example. It should be understood that the order of assembly described herein is only illustrative and that alternative procedures may be employed. For example, the substrate 14 may be mounted on the re-entrant tube 2 by fusion and then the photosensitive layer and the gold film provided thereon and leads attached thereto as described.

With the substrate assembly mounted on the re-entrant tube 2, the lead wires 20 and 22 may be turned over the edge of the substrate and soldered to the conductors 24 and 26 provided on the sides of the tube 2. The conductors 24 and 26 may be stripes composed of electrically conductive material such as silver paste or paint applied to the tube 2 by brushing or spraying, as is well known. The conductors 24 and 26 extend down along the tube 2 and over to and around the pins 6 and 8, respectively, in the header or base 4 so as to make electrical contact therewith. The lead wires 20 and 22 are attached to the conductors 24 and 26, respectively, by soldering with indium, for example.

Thereafter the tubular portion 30 of the outer envelope 28 is hermetically fused and sealed to the header or base 4 so as to contain and surround the tubular re-entrant portion 2. Preferably, the space 29, sealed off between the re-entrant portion 2, the header 4, and the outer envelope 28, is evacuated prior to sealing so as to provide the photosensitive cell in thermal isolation and to permit the effective maintenance of the cell at extremely low temperatures by filling the re-entrant tube 2 with a liquefied gas such as liquid helium, for example.

The outer envelope 28 comprises the tubular portion 30 which may be of glass or metal and a transparent infrared "window" portion 31. The infrared transparent window 31 may be of sapphire, silicon, indium arsenide, or magnesium oxide and is hermetically fused to the end of the tubular portion 30 so as to permit the transmission of photo or infrared energy therethrough and onto the photosensitive layer 12.

Figure 3:
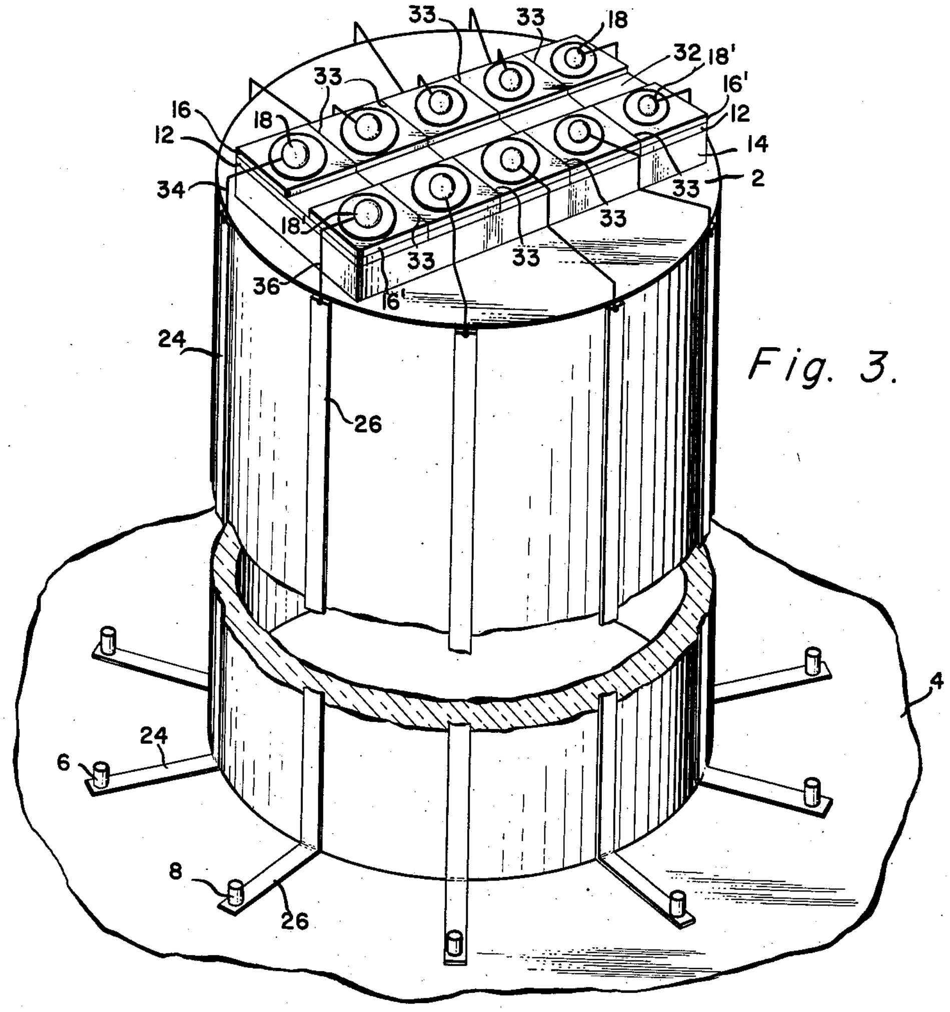
FIG. 3 is a perspective view of a multi-cell infrared device embodying the invention.

Referring now to FIG. 3, a multi-cell photosensitive device is shown which forcibly demonstrates the usefulness of the invention. The device comprises a five-cell array each having its own particular electrical connections. The substrate 14 is mounted on the re-entrant portion 2 as described previously in connection with the single cell arrangement. The outer envelope has been omitted in FIG. 3 for convenience of illustration. The substrate 14 may be of glass, for example, and is about 0.125" long by 0.053" wide. The layer 12 of photosensitive material such as lead selenide, for example, is deposited across the entire surface of the substrate as described heretofore. Two stripes 16, 16', of gold are evaporated through a mask over the layer 12 of photosensitive material so as to leave a channel 32 about 0.003" wide between the gold stripes 16, 16' exposing therebetween the photosensitive material. A plurality of independent cells are then provided by scribing with a diamond point the lines 33 about 0.0015" wide through the gold film stripes 16, 16' and through the photosensitive layer 12. In the embodiment shown, five cells are thus provided each being about 0.025" x 0.053". Thus a connection must be made to each half of each cell, the total area available for each connection being about 0.025" square. This is accomplished by the method of the invention as described previously using indium or indium-tin spheres 18, 18', about 0.013" diameter. The leads 34, 36 are secured to the indium spheres 18, 18', as described, and soldered to the conductive silver paint stripes 24 and 26 as before. The stripes 24 and 26 are in turn in contact with the pins 6 and 8 in the base 4, likewise as described before. An outer envelope, not shown, as described previously is fused to the base or header 4 to provide a completely assembled photosensitive device in a thermally insulating rugged package.

Connections to the elements of such a photo or infrared sensitive device cannot only be made more readily by the method of the invention but are at the same time more rugged. In addition the connections may be achieved without damaging the device since the employment of excessive soldering temperatures and contaminating fluxes is unnecessary in the method of the invention. Moreover, devices employing connections according to the instant teachings have significantly less noise than devices made substantially identically except for the connections made to the photosensitive elements. It was found, for example, that on devices made according to the invention that bias current densities can be increased ten times before the signal-to-noise figure of prior art devices is attained.

What is claimed is:

1. The method of providing an electrical connection to a layer of photosensitive material comprising the step of rotating under applied pressure a body of soft metal in contact with said layer until at least a portion of said body is embedded in said layer.

2. The method of providing an electrical connection to a layer of photosensitive material comprising the step of rotating under applied pressure a body of soft metal selected from the group consisting of indium and indium-tin alloys in contact with said layer until at least a portion of said body is embedded in said layer.

3. The method of providing an electrical connection to a layer of photosensitive material having a thin film of metal thereon comprising the step of rotating under applied pressure, a body of soft metal in contact with said thin metallic film until at least a portion of said body is embedded in said layer of photosensitive material.

4. The method according to claim 3 wherein said soft metal is selected from the group consisting of indium and indium-tin alloys.

5. The method of providing an electrical connection to a layer of lead selenide comprising the step of rotating under applied pressure a body of soft metal in contact with said layer until at least a portion of said body is embedded in said layer.

6. The method of providing an electrical connection to a layer of lead selenide having a thin metallic film thereon comprising a step of rotating under applied pressure a body of soft metal selected from the group consisting of indium and indium-tin alloys in contact with said thin metallic film until at least a portion of said body of soft metal is embedded in said layer of lead selenide.

7. The method of providing an electrical connection to a layer of lead selenide having a thin metallic film thereon comprising the steps of rotating under applied pressure a body of soft metal selected from the group consisting of indium and indium-tin alloys in contact with said thin metallic film until at least a portion of said body of soft metal is embedded in said layer of lead selenide, and securing a lead to said body of soft metal.

8. A photosensitive device comprising a substrate, a film of photosensitive material on said substrate, and an electrode of soft metal rotated under applied pressure into said film of photosensitive material.

9. A photosensitive device according to claim 8 wherein said electrode of soft metal is selected from the group consisting of indium and indium-tin alloys.

10. A photosensitive device comprising a substrate, a film of photosensitive material on said substrate, a thin metallic film on at least a portion of said film of photosensitive material, and an electrode of soft metal rotated under applied pressure through said thin metallic film and into said film of photosensitive material.

11. The invention according to claim 10 wherein said electrode of soft metal is selected from the group consisting of indium and indium-tin alloys.

12. A photosensitive device comprising a substrate, a film of lead selenide material on said substrate, and an electrode of soft metal rotated under applied pressure into said film of lead selenide.

13. A photosensitive device comprising a substrate, a film of lead selenide on said substrate, a thin metallic film on portions of said film of lead selenide, and an electrode of soft metal selected from the group consisting of indium and indium-tin alloys rotated under applied pressure through said thin metallic film and into said film of lead selenide.

14. A photosensitive device according to claim 13 wherein said thin metallic film is gold.

15. A photosensitive device comprising a plurality of photosensitive cells disposed on a substrate, each of said cells comprising an electrically isolated film of photosensitive material, and an electrode of soft metal rotated under applied pressure into each of said films.

16. A photosensitive device comprising a plurality of photosensitive cells disposed on a substrate, each of said cells comprising an electrically isolated film of lead selenide, and an electrode of soft metal rotated under applied pressure into each of said films of lead selenide.

17. A photosensitive device comprising a plurality of photosensitive cells disposed on a substrate, each of said cells comprising an electrically isolated film of photosensitive material, a thin metallic film on a portion of each of said films of lead selenide, and an electrode of soft metal for each of said cells rotated under applied pressure through each of said thin metallic films and into said films of lead selenide.

18. A photosensitive device according to claim 17 wherein said thin metallic film is gold and said electrode is selected from the group consisting of indium and indium-tin alloys.

19. A photosensitive device comprising a substrate, a film of lead selenide on said substrate, a thin metallic film on said film of lead selenide, an electrode of soft metal rotated under applied pressure through said thin metallic film on said film of lead selenide, and an electrical lead secured to said electrode.

20. A photosensitive device according to claim 19 wherein said thin metallic film is gold and said electrode is selected from the class consisting of indium and indium-tin alloys.

References Cited in the file of this patent

UNITED STATES PATENTS

| | | |
|---|---|---|
| 2,180,992 | Meyers | Nov. 21, 1939 |
| 2,728,835 | Mueller | Dec. 27, 1955 |
| 2,746,140 | Belser | May 22, 1956 |
| 2,776,467 | Brennan | Jan. 8, 1957 |
| 2,779,998 | Bailey | Feb. 5, 1957 |
| 2,795,039 | Hutchins | June 11, 1957 |
| 2,810,052 | Babe et al. | Oct. 15, 1957 |
| 2,861,324 | Klumpp | Nov. 25, 1958 |
| 2,884,508 | Czipott et al. | Apr. 28, 1959 |